United States Patent
Chi et al.

(10) Patent No.: US 7,335,606 B2
(45) Date of Patent: Feb. 26, 2008

(54) SILICIDE FORMED FROM TERNARY METAL ALLOY FILMS

(75) Inventors: Dongzhi Chi, Singapore (SG); Tek Po Rinus, Singapore (SG); Soo Jin Chua, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 265 days.

(21) Appl. No.: 10/799,705

(22) Filed: Mar. 15, 2004

(65) Prior Publication Data

US 2005/0202673 A1   Sep. 15, 2005

(51) Int. Cl.
*H01L 21/31* (2006.01)
*H01L 21/469* (2006.01)

(52) U.S. Cl. ............... 438/762; 438/769; 438/770; 438/635

(58) Field of Classification Search ........ 438/650–651, 438/656, 575, 580, 582, 648–649, 685–686, 438/683, 785, 581, 635, 762, 765, 768–769, 438/770, FOR. 397, FOR. 399
See application file for complete search history.

(56) References Cited

U.S. PATENT DOCUMENTS

| | | | |
|---|---|---|---|
| 6,339,021 B1 | 1/2002 | Tan et al. | |
| 6,509,094 B1 * | 1/2003 | Shah et al. | 428/395 |
| 6,531,396 B1 | 3/2003 | Chi et al. | |
| 6,605,316 B1 | 8/2003 | Visco et al. | |
| 2002/0115262 A1 | 8/2002 | Cabral et al. | |
| 2004/0209432 A1 * | 10/2004 | Ku et al. | 438/301 |

FOREIGN PATENT DOCUMENTS

| | | |
|---|---|---|
| JP | 2002124487 A | 4/2002 |
| JP | 2003-213407 A | 7/2003 |
| WO | WO 02/41745 A1 | 6/2002 |
| WO | WO 03/096407 A1 | 11/2003 |

OTHER PUBLICATIONS

D. Mangelinck et al., Applied Physics Letters, vol. 75, No. 12, Sep. 20, 1999, pp. 1736-1738.
Qu et al., Proceedings of the 6th International Conference on Solid-State and Integrated-Circuit Technology, IEEE, 2001, pp. 501-504.
Hou et al., IEEE Electron Device Letters, vol. 20, No. 11, Nov. 1999, pp. 572-573.

* cited by examiner

*Primary Examiner*—Zandra V. Smith
*Assistant Examiner*—Thanh Y. Tran
(74) *Attorney, Agent, or Firm*—Birch, Stewart, Kolasch & Birch, LLP

(57) ABSTRACT

A NiSi layer over silicon that is thermally stable and can form even in the presence of oxides. The method of fabricating the nickel silicide layer includes providing a substrate comprising silicon, depositing a layer of at least a 3-component metal alloy comprising nickel on a surface of the substrate, and annealing the alloy and the substrate. The annealing temperature is less than 1000° C. The 3-component metal alloy can include Ni, Ti and Pt.

9 Claims, 4 Drawing Sheets

SILICIDE FORMED FROM TERNARY METAL ALLOY FILMS

BACKGROUND OF THE INVENTION

1. Field of the Invention

The invention pertains to fabricating semiconductor structures, and more particularly to nickel silicide on a silicon semiconductor device wherein the nickel silicide is formed from a ternary metal alloy film.

2. Description of the Related Art

Modern semiconductor technology requires the utilization of low resistance materials in the active regions of metal-oxide-semiconductor field effect transistors (MOSFETs) and other devices. To satisfy the low-resistance requirements for source/drain and gate regions, self-aligned silicide that is simultaneously formed on the source/drain and gate regions has been widely used in the manufacturing of large-scale integrated silicon circuits.

The most common currently used materials for creating a silicide layer are titanium or cobalt. However, these silicide materials face numerous process-integration difficulties and drawbacks for future generations of semiconductor structures or devices which will feature ultra narrow lines as well as ultra shallow junctions.

For example, an unacceptably high sheet resistance results when $TiSi_2$ is formed on narrow (sub-0.1 µm) gate lines (due to the lack of nucleation centers for the transition from the undesirable C49 phase to the low resistivity C54 phase), and this high resistance presents a major drawback for this silicide material. On the other hand, $CoSi_2$ suffers from other drawbacks associated with aggressive vertical scaling, and these drawbacks include severe junction leakage, a relatively large consumption of silicon and difficulty in achieving a $CoSi_2$ layer having uniform thickness. These drawbacks limit the use of $CoSi_2$ in ultra-shallow junction devices.

Nickel monosilicide (NiSi) represents a suitable low resistivity candidate for use in future generations of silicon complementary metal oxide semiconductor (CMOS) devices. The distinct advantages of NiSi include low electrical resistivity, low Si consumption for its formation, and an ability to maintain low resistivity even at narrow line widths (sub-0.1 µm). The full implementation of NiSi in future generations of silicon semiconductor structures and devices, however, depends on the resolution of several process-integration issues.

The formation of quality NiSi crucially depends on the cleanliness of the substrate's Si surface as well as the pureness of the ambient annealing environment during thermal annealing. Any presence of residual native silicon oxide on the original silicon surface, or oxygen in the ambient annealing environment, tends to degrade the quality of the NiSi and may even cause the complete failure of NiSi formation (if the original silicon surface is covered by a continuous silicon oxide). In a manufacturing environment, the presence of native oxide represents the major hindrance to forming such a high quality NiSi layer.

For example, device wafers on the production line for Ni deposition may encounter delays. These delays allow for the growth of native oxide on the Si surface. If the growth of native oxide is substantial, it will act as a diffusion barrier for Ni, thereby preventing the diffusion of Ni into the silicon to form NiSi. Also, a partial growth of native oxide on localized areas of the Si surface will lead to non-uniform growth of NiSi, resulting in rough interfaces and consequent high diode leakage on ultra-shallow junction devices.

In addition, NiSi is not thermally stable at relatively high processing temperatures. For thin NiSi films, severe agglomeration (or NiSi island formation) normally begins to occur at 600° C., while the transformation of NiSi to $NiSi_2$ takes place at 700° C. Both NiSi agglomeration and NiSi-to-$NiSi_2$ transformation degrade the electrical properties of nickel silicide films and cause leakage problems in silicided shallow junctions.

Related art technologies have attempted to address the deficiencies of semiconductor devices incorporating NiSi films. These related art technologies are typified by U.S. Pat. No. 6,339,021 (titled "Methods for effective nickel silicide formation"), which describes a method of forming a NiSi layer on a semiconductor structure or device in the presence of native oxide. This method includes at least the following three embodiments: 1) providing a thin Ti capping layer over an underlying Ni layer; 2) providing a TiN layer over a Ti capping layer which is over a Ni layer, in order to free all the Ti atoms in the Ti capping layer for reaction with the underlying native oxide at the Ni—Si interface; and 3) providing a monolayer of Ti sandwiched between the native oxide and Ni. In each of these embodiments, the Ti is made mobile to react with and to reduce the native chemical oxide layer when the substrate is annealed at 600° C. and to transform the Ni into NiSi.

Another approach to the NiSi problem is typified by U.S. Pat. No. 6,531,396 (titled, "Method of fabricating a nickel/platinum monosilicide film"), which describes a method of forming a NiSi layer on a semiconductor structure or device by incorporating a small amount of Pt (5 at. %) into Ni to increase the $NiSi_2$ nucleation temperature and NiSi agglomeration temperature.

This mono-metal doping approach was also tried in PCT Application no. PCT/SG03/00096 (titled, "Method for forming a nickel silicide later on a silicon substrate"). This application describes a method of forming a NiSi layer on a semiconductor structure or device that has a layer of native oxide on the Si substrate without an increase in silicidation reaction temperature by incorporating a small amount of Ti (5 at. %). The Ti atoms reduce the interfacial oxide to provide a diffusion membrane facilitating the influx of Ni into Si substrate to form NiSi.

The above-described technologies seek to solve the particular process-integration issues that are experienced in established methods for implementation in future generations of semiconductor structures or devices. That is, NiPt specifically addresses $NiSi_2$ nucleation and NiSi agglomeration, and NiTi specifically addresses NiSi sensitivity to interfacial oxides. However, distinct disadvantages of the above-described technologies arise from their inability to solve the two process-integration problems described above (non-uniform growth and thermal instability), which are the most probable concurrently occurring problems associated with the NiSi process. As a result, there is a need for an effective technology that will permit the utilization of NiSi in very small submicron line width semiconductor devices.

SUMMARY OF THE INVENTION

It is accordingly an object of the invention to overcome the disadvantages of the related art.

It is also an object of the invention to provide a NiSi layer that has been grown uniformly and has thermal stability.

Furthermore, it is an object of the invention to provide an NiSi layer that can be grown despite oxide suppression.

The invention, in part, pertains to a method of fabricating a nickel silicide layer that includes providing a silicon substrate, depositing a layer of at least a 3-component metal alloy comprising nickel on a surface of the silicon substrate, and annealing the alloy and the silicon substrate to form a silicide layer comprising nickel.

The invention, in part, pertains to a semiconductor comprising a layer of silicide comprising nickel prepared by said method.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention. The drawings illustrate embodiments of the invention and together with the description serve to explain the principles of the embodiments of the invention.

DETAILED DESCRIPTION

Figure 1:
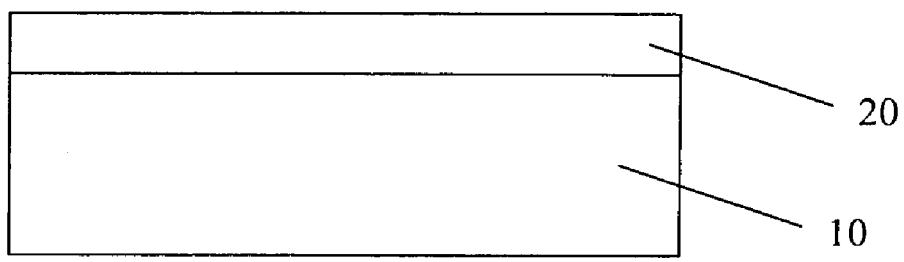
FIG. 1 shows a silicon substrate and oxide layer.

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

NiSi formation can be effectively suppressed or completely inhibited if a thin interfacial silicon oxide (or residual oxide) is present between the deposited nickel film and the substrate comprising silicon. This sensitivity of NiSi formation to surface native oxide (less than 2 nm thick) is one of the major concerns for the application of NiSi to silicide process in advanced complementary metal oxide semiconductor (CMOS) devices.

In addition, the transformation of NiSi into high resistivity $NiSi_2$ during high temperature post-silicidation processes represents another integration concern, which also needs to be resolved prior to the implementation of NiSi into silicide process.

To overcome the disadvantages of the related art NiSi technology, the inventors investigated the formation of NiSi and the morphological and thermal stability of NiSi that is formed using a ternary metal film, typically a Ni(Pt, Ti) alloy film (instead of pure Ni), to simultaneously resolve these two integration issues using a single process step.

The invention, in part, pertains to a method of fabricating a nickel silicide layer that includes providing a substrate comprising silicon, depositing a layer of at least a 3-component metal alloy comprising nickel on a surface of the substrate, and annealing the alloy and the substrate to form a silicide layer comprising nickel.

The invention, in part, pertains to a semiconductor comprising a layer of silicide comprising nickel.

The nickel and the platinum in the alloy layer react with silicon atoms at the surface of the substrate and form a NiPtSi layer on the surface, and a thin native silicon oxide, if present on the surface, does not inhibit the formation of the NiPtSi layer due to the reaction of Ti with the silicon oxide to form titanium oxides which migrate to the top surface of the NiPtSi layer.

The substrate comprising silicon includes gate, source and drain regions and optionally contact regions. Also, the substrate can be a (001) Si substrate.

The 3-component metal alloy is formed in a thickness of at least about 25 Angstroms. Preferably, the thickness is up to 500 Angstroms. More preferably, the thickness is 50 to 500 Angstroms. The method of forming the alloy on the substrate is not particularly limited; however, it is preferred to form the alloy by sputter deposition, thermal evaporation deposition or CVD. Most preferably by sputter deposition.

The annealing of the alloy on the substrate is performed at a temperature of at least 350° C. Preferably the temperature of annealing is less than 1000° C. Most preferably, the annealing temperature is 400° C. to 800° C. The annealing step can be performed in a vacuum, in nitrogen gas or in another inert gas. Any excess metal alloy remaining after the annealing step, which has not reacted with at least one silicon surface, and the titanium oxide can be removed from the semiconductor structure.

The 3-component alloy is $Ni_{1-x-y}Ti_xPt_y$, where x>0 and y>0. Preferably, x is less than 0.25 and y is less than 0.25. Most preferably, ranges include $0.10 \geq x \geq 0.02$ and $0.10 \geq y \geq 0.02$.

In the invention, $NiSi_2$ formation is suppressed up to a temperature of about 800° C. Also, there is no substantial film agglomeration and there is essentially no $NiS_2$ formation at temperatures up to about 800° C.

Figure 2:
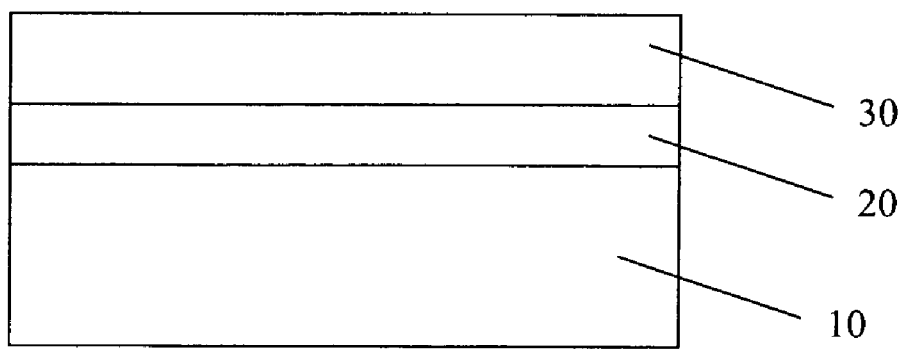
FIG. 2 shows a ternary nickel alloy deposed over the silicon substrate and oxide layer of FIG. 1.

FIG. 1 shows a typical Si substrate 10 that has a surface coating of oxide film 20. FIG. 2 shows a coating of ternary nickel alloy 30 that is deposed over the oxide film 20.

However, if no oxidation has occurred, the oxide film 20 may not be present and the ternary metal alloy 30 may be deposed directly over the substrate 10. Also, the oxide film 20 may not be uniform, and the oxide film 20 may be in the form of islands or particles (not shown) that have formed over the Si substrate 10.

Figure 3:
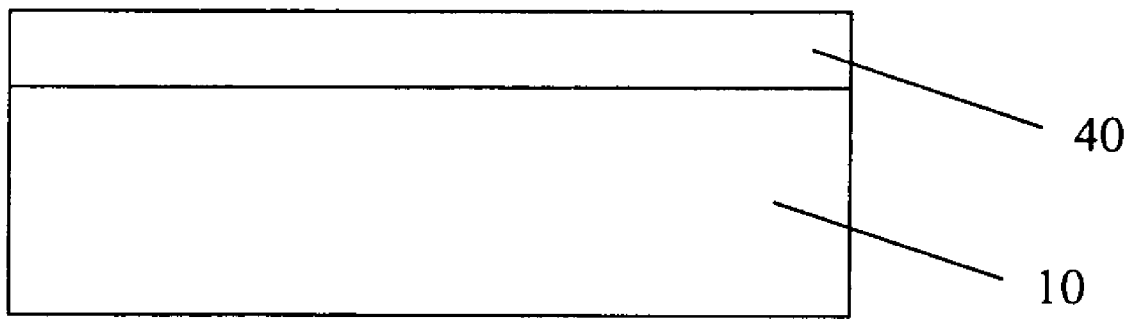
FIG. 3 shows the inventive NiSi layer over the substrate.

After deposition of the ternary nickel alloy 30, an annealing step is performed to convert the structure to a NiPtSi layer 40 over the Si substrate 10, as is shown in FIG. 3. During the annealing step, the titanium reacts with the oxygen in the silicon oxide layer allowing the nickel to diffuse through the oxide layer to interact with the Si substrate to form the desired NiPtSi layer. It is to be noted that none of FIGS. 1-3 are drawn to scale.

The annealing step is preferably a rapid thermal annealing (RTA) performed in an inert atmosphere (such as nitrogen, argon, neon or xenon). The RTA time is most preferably about 1 to 60 seconds. However other times can be used up to about 30 minutes. The preferable annealing time range is about 1 second to about 2 minutes.

If any residual ternary nickel alloy remains or if an oxide of one of the metals in the alloy forms on the surface, this residue can be readily removed using a dry or wet etching process.

The Ti in the ternary nickel alloy alters the nature of the interfacial chemical oxide, from being an effective kinetic diffusion barrier for Ni to being a Ni permeable diffusion membrane, through its reaction with the interfacial oxide, thus having facilitated the influx of Ni into Si for the formation of NiSi. This function is not restricted to Ti, but any appropriate metal can be used, such as Zr or Hf. The Pt specifically addresses $NiSi_2$ nucleation and NiSi agglomeration issues. Metals other than Pt can be used to control agglomeration, such as Pd.

The preferred ternary nickel alloy is NiTiPt. This ternary alloy can typically be $Ni_{0.9}Ti_{0.05}Pt_{0.05}$. Other compositions can be $Ni_{0.8}Ti_{0.1}Pt_{0.1}$ or $Ni_{0.85}Ti_{0.075}Pt_{0.075}$.

The substrates used in the invention can include p-type (001) Si wafers. However, the invention is not restricted to this substrate, and any appropriate substrate comprising Si can be used such as (111) Si, (011) Si or $Si_{1-x}Ge_x$, wherein x<1. Also the substrate need not be a Si wafer, but can be Si grown on another material such as metal.

The physical mechanism of the reduction of interfacial oxide by Ti can be described as follows. First, upon annealing, Ti in the original $Ni_{1-x-y}Ti_xPt_y$ alloy film reacts with the interfacial oxide, changing the nature of the interfacial oxide from being an effective diffusion barrier for Ni and Pt to a diffusion membrane, thus allowing for the downward diffusion of Ni and Pt through the altered oxide into the underlying silicon. The Ni and Pt atoms migrate through the altered-oxide/silicon interface and then react with the silicon to form a nickel silicide layer which contains a small amount of Pt in an alloy form (but virtually with no Ti due to the very low solubility of Ti in nickel silicides).

Since both Ni and Pt migrate during the reaction, the altered oxide layer is pushed towards the free surface as more Ni diffuses towards the underlying Si substrate. Si does not diffuse through the oxide in the opposite direction, and therefore the oxide layer is always present at the boundary between the growing silicide and any unreacted metal still present. After all the Ni has been consumed by the silicidation reaction, the altered oxide layer is left on top of the silicide layer. The altered layer present on the surface is in a form of $Ti(Ni, Pt)Si_yO_z$ oxide compound and can be selectively etched off using a suitable solution.

The enhanced thermal stability of NiSi by the presence of Pt, on the other hand, can be understood from an equilibrium thermodynamic perspective using entropy of mixing and classical nucleation theory. Since a solution with a complete solubility (like Ni(Pt)Si) possesses higher entropy, the phase change from Ni(Pt)Si (i.e., NiSi with a small amount of Pt) to $NiSi_2$+PtSi results in a decrease in the total entropy of the system, yielding a reduction in the drive for the disilicide, i.e., $NiSi_2$, formation. In other words, the $NiSi_2$ formation temperature increases. Consequently, the NiSi with Pt exhibits much improved thermal stability.

The invention therefore increases the thermal stability of the NiSi layer by almost 100° C. In the invention, the NiSi is observed to be thermally stable up to about 800° C.

It is important to note that the suppressed sensitivity of NiSi formation to interfacial oxide as well as the enhanced thermal stability of NiSi formed using $Ni_{1-x-y}Ti_xPt_y$ alloy film are achieved without causing other adverse effects, such as an increase in electrical resistivity or the need for additional process steps. Also, the Ti in the $Ni_{1-x-y}Ti_xPt_y$ does not react with thick thermal/PECVD/CVD silicon oxides or other commonly used insulating dielectrics such as $SiN_x$. This thus assures the selective formation of NiSi only on the desired regions, i.e., exposed silicon or native oxide (less than 2 nm thick) regions. Unreacted $Ni_{1-x-y}Ti_xPt_y$ on top of thermal/PECVD/CVD silicon oxides or other insulating dielectrics films can be easily removed using selective etching.

EXAMPLES

The substrates used were p-type (001) Si wafers. After the standard RCA cleaning, the Si substrates were dipped in a diluted HF solution prior to metallization. To provide a well-controlled form of a thin interfacial oxide (with a similar thickness to native silicon oxide, 12-15 Å thick), chemically grown silicon oxide was also grown by immersing the Si substrates in a boiling $HCl/H_2O_2/H_2O$ solution. Pure Ni and $Ni_{0.9}Ti_{0.05}Pt_{0.05}$ films of 30 nm were then deposited by magnetron sputtering on the (001) Si substrates. The metallized samples were subsequently subjected to ex-situ rapid thermal annealing (RTA) in an $N_2$ ambient atmosphere for 60 seconds at temperatures ranging from about 300 to 800° C. The silicide films were analyzed using x-ray diffraction (XRD) and secondary ions mass spectroscopy (SIMS).

Figure 4:
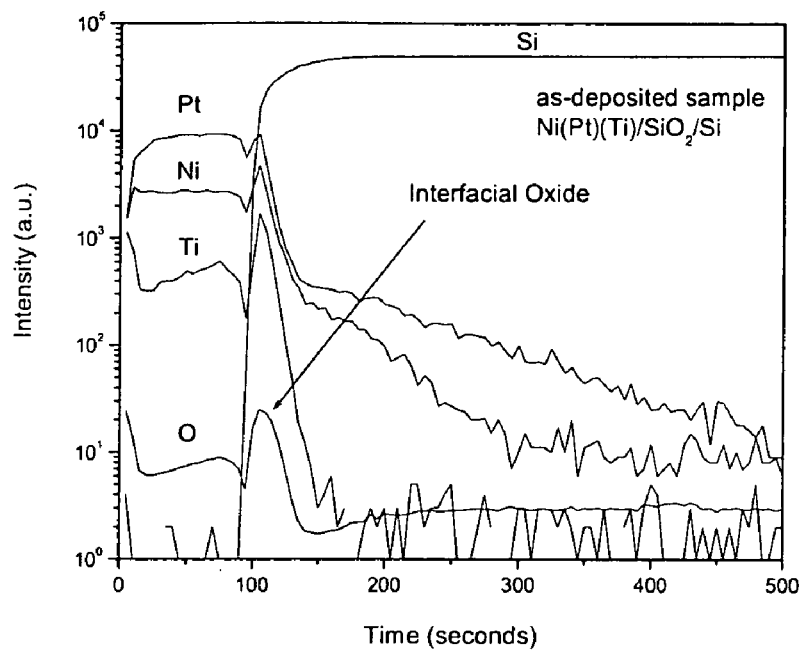
FIG. 4 shows a SIMS depth profile for Ni, Pt, Ti and O in an as-deposited sample of $Ni_{0.9}Ti_{0.5}Pt_{0.05}/SiO_2/Si$.

FIG. 4 shows the SIMS depth profile for Ni, Pt, Ti and O in an as-deposited sample of $Ni_{0.9}Ti_{0.05}Pt_{0.05}/SiO_2/Si$. An oxygen concentration peak at the interface of metal and Si substrate for a sputtering time of between 90 to 140 seconds indicates the presence of a thin chemically grown interfacial oxide. A similar SIMS depth profile was also seen for an as-deposited sample of $Ni/SiO_2/Si$ (not shown). Subsequently, the two samples were subjected to RTA at 400° C. and then SIMS measurements were carried out. The SIMS depth profiling for $Ni/SiO_2/Si$ exhibits almost the same depth profiling as that for an as-deposited $Ni/SiO_2/Si$ sample, indicating that the chemically grown interfacial oxide is an effective diffusion barrier for Ni, thus prohibiting NiSi formation.

Figure 5:
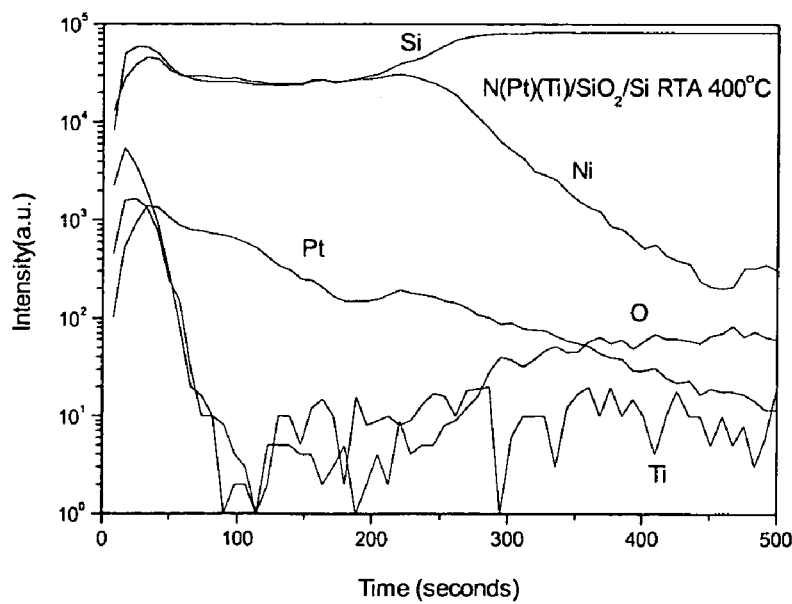
FIG. 5 shows a SIMS depth profile indicating interdiffusion between Ni, Pt, Ti and Si.

On the other hand, SIMS depth profiling of the $Ni_{0.9}Ti_{0.05}Pt_{0.05}/SiO_2/Si$ sample (shown in FIG. 5) shows that an inter-diffusion between Ni, Pt, Ti and Si had occurred even in the presence of the interfacial oxide. The initial interfacial oxide characterized by the oxygen concentration peak (as seen in the as-deposited samples) has been reduced to noise level limits within the bulk NiSi formed. The Ti in the $Ni_{0.9}Ti_{0.05}Pt_{0.05}$ has altered the nature of the interfacial chemical oxide from being an effective kinetic diffusion barrier for Ni to being a Ni permeable diffusion membrane, through its reaction with the interfacial oxide. The Ti thus facilitates the influx of Ni into Si for the formation of NiSi.

Figure 6:
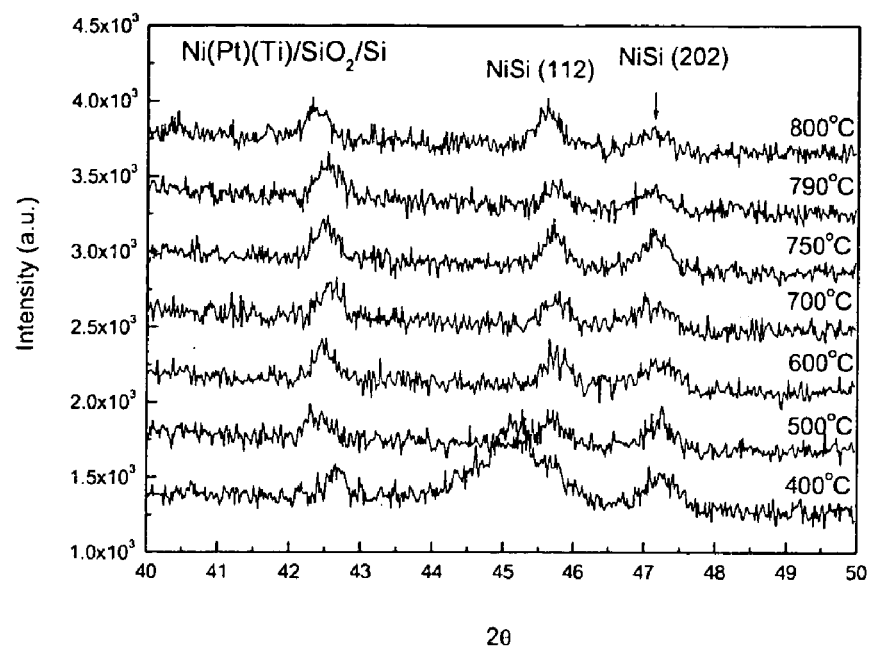
FIG. 6 shows an XRD measurement indicating the presence of polycrystalline NiSi as high as 800° C.
Figure 7:
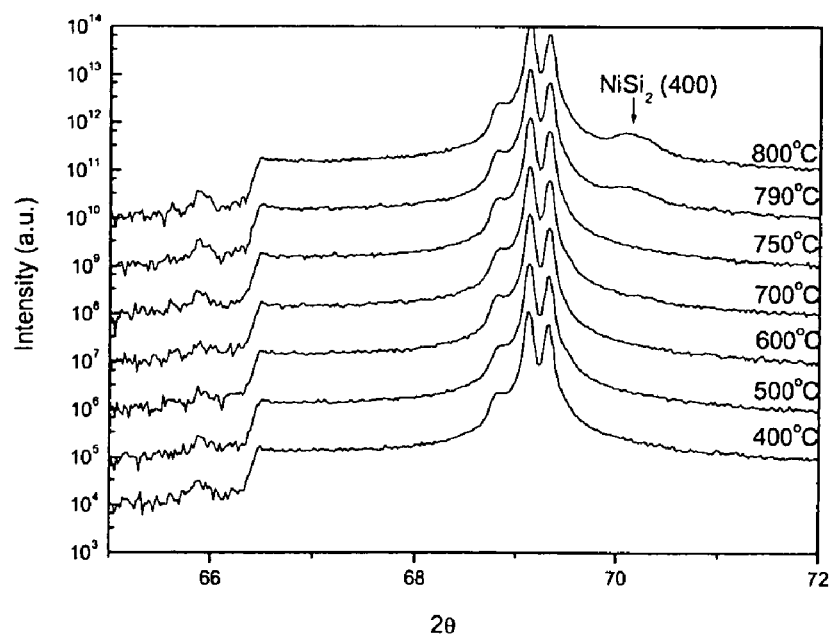
FIG. 7 shows an XRD measurement indicating the suppression of $NiSi_2$ formation up to 800° C.

To monitor the transformation of NiSi to $NiSi_2$, XRD measurement was carried out for both pure Ni/Si and $Ni_{0.9}Ti_{0.05}Pt_{0.05}/Si$ samples. For Ni/Si samples, XRD peaks corresponding to polycrystalline NiSi phase only were observed after silicidation annealing at temperatures between 400 and 650° C., while epitaxial $NiSi_2$ peaks were detected (not shown) after silicidation annealing at 700° C. or above. In contrast, for $Ni_{0.9}Ti_{0.05}Pt_{0.05}/Si$ samples, peaks corresponding to polycrystalline NiSi were present for annealing temperatures as high as 800° C. (see FIG. 6) with epitaxial $NiSi_2$ peak appearing at 790° C. or above (see FIG. 7), indicating an almost 100° C. increase in the NiSi-to-$NiSi_2$ transformation temperature. This improvement in NiSi thermal stability, i.e., dramatically increased the NiSi-to-$NiSi_2$ transformation temperature, is attributed to the presence of a small amount of Pt in NiSi formed, which resulted in a decrease of the Gibbs free energy and thus stabilization of the silicide.

In summary, it has been demonstrated that the new NiSi silicide process using $Ni_{1-x-y}Ti_xPt_y$ alloy film can effectively address the two major concerns related to NiSi process integration, i.e., NiSi sensitivity to interfacial oxide for its formation and the transformation of NiSi to high resistivity $NiSi_2$ at elevated process temperatures, simultaneously without additional process steps and noticeable adverse effects. The reduced NiSi sensitivity to the interfacial oxide for its formation would significantly reduce the manufacturing yield loss, which is probably caused by the re-growth of native oxide on exposed silicon regions during the time lag encountered prior to metallization process in a manufacturing environment. On the other hand, the enhanced thermal stability would significantly widen the process window for both silicidation and post-silicidation processes. The use of $Ni_{1-x-y}Ti_xPt_y$ ensures a robust NiSi process which features a significantly reduced sensitivity of NiSi formation to interfacial oxide as well as highly stable NiSi films.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

What is claimed is:

1. A method of fabricating a nickel silicide layer, which comprises:
    providing a substrate comprising silicon and silicon oxide;
    depositing a layer of at least a 3-component metal alloy on a surface of the substrate; and
    annealing the alloy and the substrate to form the nickel silicide layer,
    wherein the alloy comprises nickel, titanium and platinum,
    and wherein the nickel and the platinum in the alloy react with silicon at the surface and form a nickel-platinum silicide layer on the surface, and wherein the titanium reacts with any residual silicon oxide which may be present on the silicon surface to promote the reaction of nickel and platinum with silicon.

2. The method of claim 1, wherein there is no substantial film agglomeration and $NiS_2$ formation.

3. The method according to claim 1, wherein said substrate comprising silicon includes gate, source and drain regions and contact regions.

4. The method according to claim 1, wherein the 3-component metal alloy is sputter deposited to a thickness of up to 500 Angstroms.

5. The method according to claim 1, wherein the annealing is performed at a temperature of up to 800° C.

6. The method according to claim 1, wherein any excess metal alloy, which has not reacted with at least one surface of the substrate, is removed from the semiconductor structure.

7. The method according to claim 1, wherein the alloy consists of $Ni_{1-x-y}$ $Ti_xPt_y$ wherein $0.25 \geq x \geq 0.02$ and $0.25 \geq y \geq 0.02$.

8. The method according to claim 1, wherein the annealing is performed in a vacuum, in nitrogen gas or in another inert gas.

9. The method according to claim 1, wherein the substrate is at least one selected from the group consisting of a (001)Si substrate, (011) Si, (111)Si and $Si_{1-x}Ge_x$, wherein x<1.

* * * * *